United States Patent
White

(10) Patent No.: US 10,318,416 B2
(45) Date of Patent: Jun. 11, 2019

(54) METHOD AND SYSTEM FOR IMPLEMENTING A NON-VOLATILE COUNTER USING NON-VOLATILE MEMORY

(71) Applicant: NXP B.V., Eindhoven (NL)

(72) Inventor: Adam Jerome White, Phoenix, AZ (US)

(73) Assignee: NXP B.V., Eindhoven (NL)

(*) Notice: Subject to any disclaimer, the term of this patent is extended or adjusted under 35 U.S.C. 154(b) by 38 days.

(21) Appl. No.: 15/599,237

(22) Filed: May 18, 2017

(65) Prior Publication Data
US 2018/0336130 A1   Nov. 22, 2018

(51) Int. Cl.
| | |
|---|---|
| *G06F 3/06* | (2006.01) |
| *G06F 12/06* | (2006.01) |
| *G11C 16/10* | (2006.01) |
| *G11C 16/34* | (2006.01) |
| *H03K 21/40* | (2006.01) |

(52) U.S. Cl.
CPC ........... *G06F 12/06* (2013.01); *G06F 3/0614* (2013.01); *G06F 3/0638* (2013.01); *G06F 3/0679* (2013.01); *G11C 16/10* (2013.01); *G11C 16/349* (2013.01); *H03K 21/40* (2013.01); *H03K 21/403* (2013.01); *G06F 2212/72* (2013.01)

(58) Field of Classification Search
CPC .................................................. H03K 23/002
See application file for complete search history.

(56) References Cited

U.S. PATENT DOCUMENTS

| | | | |
|---|---|---|---|
| 4,839,909 A | 6/1989 | Warner | |
| 5,105,449 A | 4/1992 | Bennett et al. | |
| 5,181,231 A | 1/1993 | Parikh et al. | |
| 5,404,485 A * | 4/1995 | Ban .................. | G06F 3/0601 711/202 |
| 7,120,220 B2 | 10/2006 | Du et al. | |
| 2008/0043899 A1* | 2/2008 | Gara .................. | H03K 21/026 377/118 |
| 2009/0259877 A1 | 10/2009 | Vyssotski et al. | |
| 2014/0089612 A1* | 3/2014 | Feldhofer .......... | G06F 12/00 711/156 |
| 2017/0004071 A1 | 1/2017 | Van Keer et al. | |

FOREIGN PATENT DOCUMENTS

EP    2713519 A1    4/2014

* cited by examiner

*Primary Examiner* — Gary W. Cygiel

(57) ABSTRACT

A method for implementing a non-volatile counter using non-volatile memory is disclosed. In an embodiment, the method involves distributing operations for storing a low word of a counter in non-volatile memory across memory cells in a memory array in the non-volatile memory, and storing additional bits of the counter in the non-volatile memory in memory cells outside of the memory array, wherein the location in the memory array at which the low word is stored is determined for each count based on the upper bits of the counter.

13 Claims, 9 Drawing Sheets

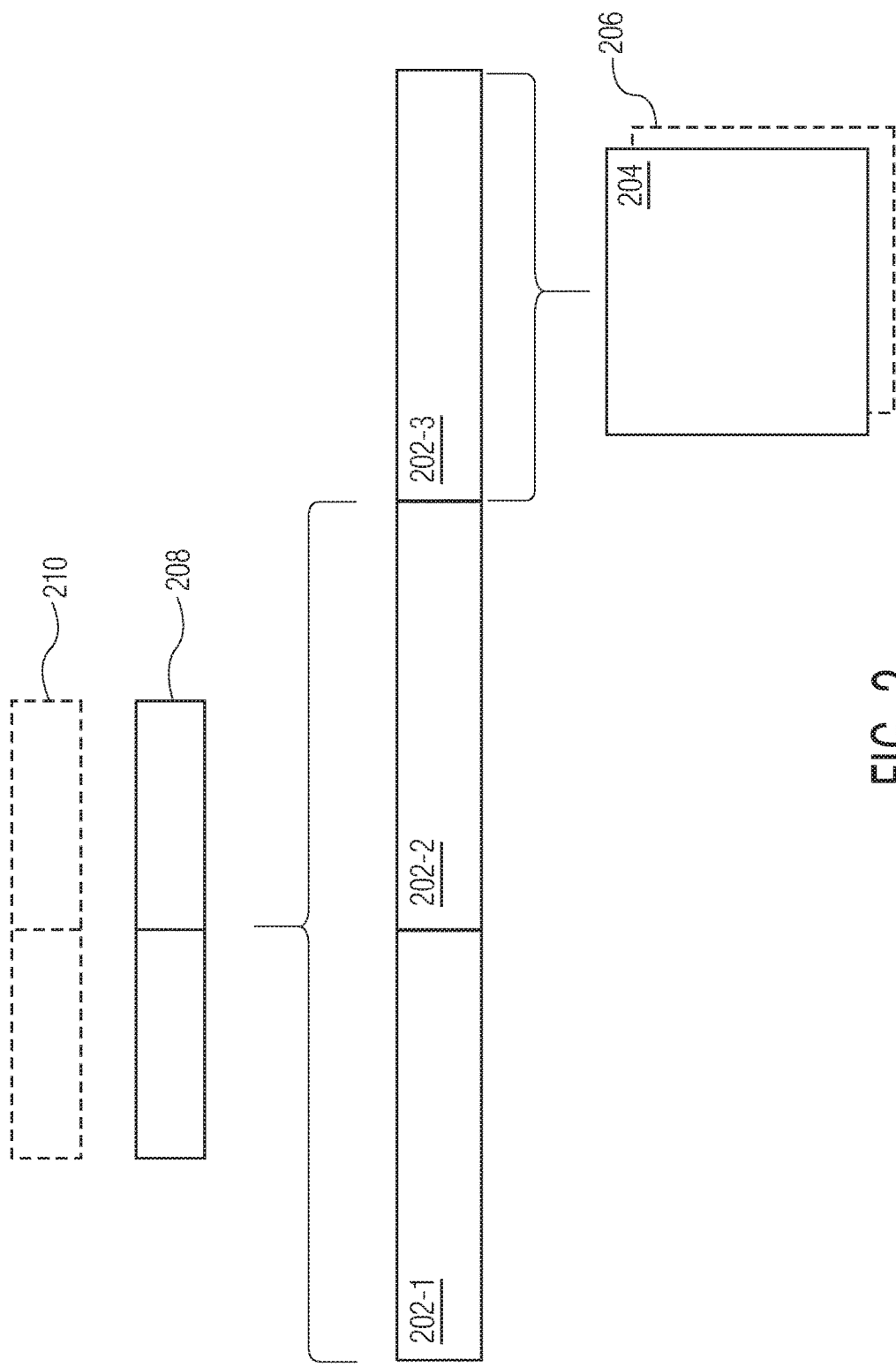

FIG. 3D

| BIT | 15 | 14 | 13 | 12 | 11 | 10 | 9 | 8 |
|-----|----|----|----|----|----|----|----|----|
| VALUE | 0 | 0 | 0 | 1 | 0 | 0 | 0 | 0 |

| PAGE NUMBER \ MEMORY CELL ON PAGE | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 128 |
| 1 | 0 | 0 | 0 | 0 | 0 | 0 | 0 | 0 | 0 | 0 | 0 | 0 | 0 | 0 | 0 | 64 |
| 2 | 0 | 0 | 0 | 0 | 0 | 0 | 0 | 0 | 0 | 0 | 0 | 0 | 0 | 0 | 0 | 32 |
| 3 | 0 | 0 | 0 | 0 | 0 | 0 | 0 | 0 | 0 | 0 | 0 | 0 | 0 | 0 | 0 | 16 |
| 4 | 0 | 0 | 0 | 0 | 0 | 0 | 0 | 0 | 0 | 0 | 0 | 0 | 0 | 0 | 0 | 8 |
| 5 | 0 | 0 | 0 | 0 | 0 | 0 | 0 | 0 | 0 | 0 | 0 | 0 | 0 | 0 | 0 | 4 |
| 6 | 0 | 0 | 0 | 0 | 0 | 0 | 0 | 0 | 0 | 0 | 0 | 0 | 0 | 0 | 0 | 2 |
| 7 | 0 | 0 | 0 | 0 | 0 | 0 | 0 | 0 | 0 | 0 | 0 | 0 | 0 | 0 | 0 | 1 |
| 8 | 0 | 0 | 0 | 0 | 0 | 0 | 0 | 0 | 0 | 0 | 0 | 0 | 0 | 0 | 0 | 0 |
| 9 | 0 | 0 | 0 | 0 | 0 | 0 | 0 | 0 | 0 | 0 | 0 | 0 | 0 | 0 | 0 | 0 |
| 10 | 0 | 0 | 0 | 0 | 0 | 0 | 0 | 0 | 0 | 0 | 0 | 0 | 0 | 0 | 0 | 0 |
| 11 | 0 | 0 | 0 | 0 | 0 | 0 | 0 | 0 | 0 | 0 | 0 | 0 | 0 | 0 | 0 | 0 |
| 12 | 0 | 0 | 0 | 0 | 0 | 0 | 0 | 0 | 0 | 0 | 0 | 0 | 0 | 0 | 0 | 0 |
| 13 | 0 | 0 | 0 | 0 | 0 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 | 0 | 0 | 0 | 0 | 0 |
| | 255 | 255 | 255 | 255 | 255 | 255 | 255 | 255 | 255 | 255 | 255 | 255 | 255 | 255 | 255 | 255 |

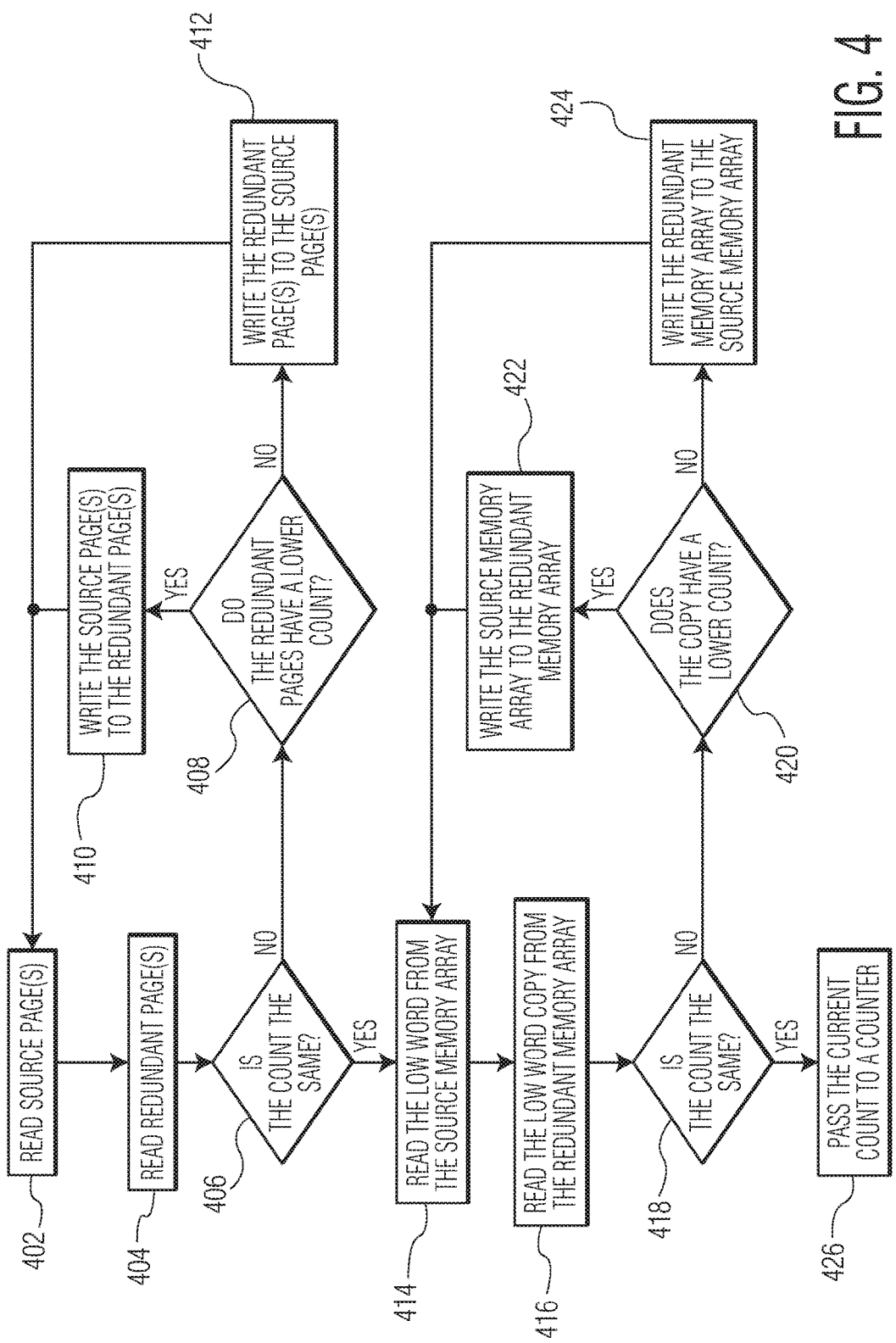

METHOD AND SYSTEM FOR IMPLEMENTING A NON-VOLATILE COUNTER USING NON-VOLATILE MEMORY

BACKGROUND

There are many applications for a non-volatile, non-decreasing counter in electronic devices. For example, such a counter may be used to count the number of times an integrated circuit (IC) device powers on, as an anti-counterfeit measure in a print cartridge to count the number of prints, for security checks, or for avoiding counter roll-back attacks. As the use of non-volatile memory, such as electrically erasable programmable read-only memory (EEPROM), increases in electronic devices, implementing a non-volatile, non-decreasing counter in non-volatile memory becomes desirable.

One solution for implementing a counter using non-volatile memory is to implement a binary counter that stores its value in memory cells. However, memory cells in certain types of non-volatile memory may wear out and become unreliable after a number of program cycles have been performed. In situations with very large counts, the number of program cycles that can be performed before a memory cell wears out and becomes unreliable can be a limiting factor. Typically, the memory cell storing the least significant bit will be programmed or erased for each count, which will cause the memory cell storing the least significant bit to wear out or become unreliable sooner than other memory cells in the non-volatile memory. Thus, a counter using a type of non-volatile memory in which memory cells may wear out and become unreliable typically cannot count higher than the number of program cycles that can be performed on the memory cell in which the least significant bit is stored or else the count may become corrupted.

SUMMARY

In accordance with an embodiment of the invention, a method for implementing a non-volatile counter using non-volatile memory is disclosed. In an embodiment, the method involves distributing operations for storing a low word of a counter in non-volatile memory across memory cells in a memory array in the non-volatile memory, and storing additional bits of the counter in the non-volatile memory in memory cells outside of the memory array, wherein the location in the memory array at which the low word is stored is determined for each count based on the upper bits of the counter.

In a second embodiment, an operation for storing the low word of the counter in non-volatile memory involves programming a memory cell in the memory array when a bit is set to 1, and erasing a memory cell in the memory array when a bit set to 1 is set to 0.

In another embodiment, the memory array includes a number of memory pages that is at least equal to a number of bits in the low word.

In another embodiment, prior to performing an operation for storing the low word of the counter in non-volatile memory, the method involves reading the additional bits of the counter from a memory page outside of the memory array, determining an X offset and a Y offset from the additional bits, and reading the low word from the memory array starting with the memory cell at a memory cell position equal to the Y offset on a memory page within the memory array having an index equal to the X offset.

In another embodiment, the method further involves reading the additional bits of the counter from at least one redundant memory page, reading the low word starting with the memory cell at a memory cell position equal to the Y offset on a memory page in a redundant memory array with a page index equal to the X offset, comparing the bits read from the at least one redundant memory page with the bits read from the at least one memory page, at least one of writing the bits read from the at least one redundant memory page to the at least one memory page if a binary value of the bits read from the at least one redundant memory page is higher than the binary value of bits read from the at least one memory page and writing the bits read from the at least one memory page to the at least one redundant memory page if the binary value of the bits read from the at least one redundant memory page is lower than the binary value of the bits read from the at least one memory page, comparing the low word read from the redundant memory array with the low word read from the memory array, and at least one of writing the low word read from the redundant memory array to the memory array if a binary value of the low word read from the redundant memory array is higher than a binary value of the low word read from the memory array and writing the low word read from the memory array to the redundant memory array if a binary value of the low word read from the redundant memory array is lower than a binary value of the low word read from the memory array.

In another embodiment, a non-volatile memory is disclosed. In an embodiment, the non-volatile memory involves a memory controller, at least one memory page electrically coupled to the memory controller, and a memory array electrically coupled to the memory controller, wherein the memory controller is configured to manage a flow of data to the non-volatile memory by storing a low word of the data in the memory array and by storing additional bytes of the data in the at least one memory page, and wherein the low word is stored at a location in the memory array determined based on the additional bytes.

In another embodiment, the memory controller is further configured to read the additional bytes of the at least one memory page, determine an X offset and a Y offset from the additional bytes, and read the low word from the memory array starting with the bit at a memory cell position equal to the Y offset on a page with an index equal to the X offset.

In another embodiment, the memory controller is further configured to read bytes of at least one redundant memory page, read the low word starting at the memory cell position equal to the Y offset on a memory page in a redundant memory array with a page index equal to the X offset, compare the bytes read from the at least one redundant memory page with the byte read from the at least one memory page, at least one of write the bits read from the at least one redundant memory page to the at least one memory page if a binary value of the bits read from the at least one redundant memory page is higher than a binary value of the bits read from the at least one memory page and write the bits read from the at least one memory page to the at least one redundant memory page if the binary value of the bits read from the at least one redundant memory page is lower than the binary value of the bits read from the at least one memory page, compare the low word read from the redundant memory array with the low word read from the memory array, and at least one of write the low word read from the redundant memory array to the memory array if the binary value of the low word read from the redundant memory array is higher than the binary value of the low word read from the memory array and write the low word read from the memory array to the redundant memory array if the binary value of the low word read from the redundant memory array is lower than the binary value of the low word read from the memory array.

In another embodiment, a method for implementing a non-volatile counter using non-volatile memory is disclosed. In an embodiment, the method involves storing a low word of a multi-bit counter to a memory array formed by at least one byte and a plurality of memory pages in an non-volatile memory by determining an X offset having an initial value and determining a Y offset having an initial value, storing the low word in memory cells at a memory cell position equal to the Y offset on memory pages in the plurality of memory pages starting with the memory page corresponding to the page with a page index equal to the X offset, incrementing the X offset after a first number of updates to the memory cells at the memory cell position equal to the Y offset, resetting the X offset to the initial value and incrementing the Y offset when the X offset is incremented to a value greater than the number of memory pages in the plurality of memory pages, and repeatedly incrementing and resetting the X offset, while incrementing the Y offset until the Y offset is equal to the highest memory cell position within a memory page in the plurality of memory pages and the X offset is equal to the number of memory pages in the plurality of memory pages, and storing additional bits of the multi-bit counter to at least one memory page in the non-volatile memory.

In another embodiment, storing at least one of a bit in the low word and a bit in the additional bits involves programming a bit to transition from 0 to 1, and erasing a bit to transition from 1 to 0.

In another embodiment, the number of memory pages in the plurality of memory pages is at least equal to a number of bits in the low word.

In another embodiment, prior to storing the low word of the multi-bit counter and storing additional bits of the multi-bit counter, the method involves reading additional bits of the multi-bit counter from at least one memory page in the non-volatile memory, determining an X offset and a Y offset from the additional bits, and reading the low word from the memory array starting with the bit at the memory cell position equal to the Y offset on a page with an index equal to the X offset.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

FIG. 2 depicts a functional diagram of a register of a 24-bit counter and EEPROM space.

FIGS. 3A-3D illustrate storing a low word in a two-dimensional memory array in accordance with an embodiment of the invention.

FIG. 4 is a flow chart diagram of a technique for protecting a non-volatile counter circuit using EEPROM against power failures.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
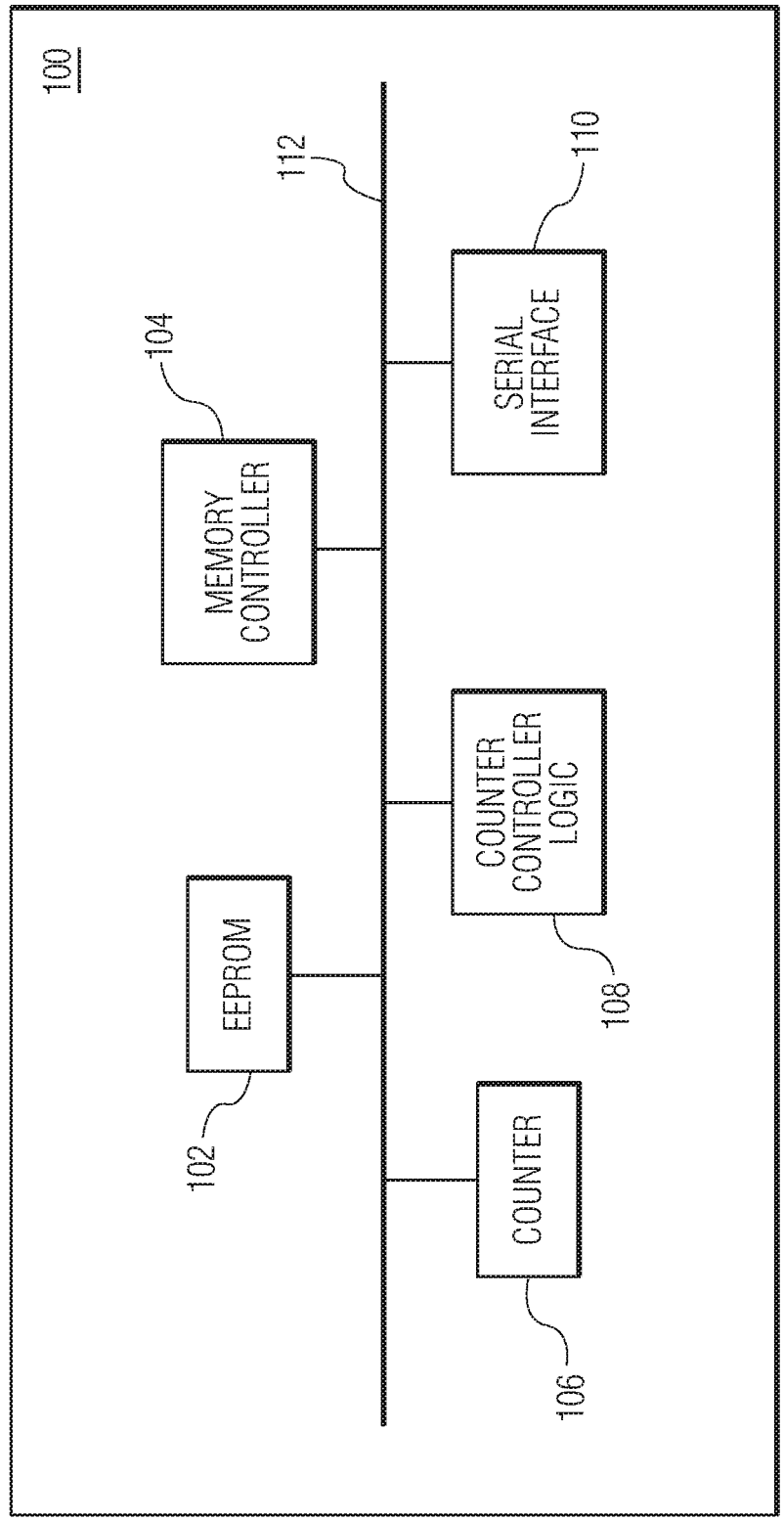
FIG. 1 depicts a functional block diagram of an embodiment of a general non-volatile counter circuit in accordance with the invention.

FIG. 1 depicts a functional block diagram of an embodiment of a non-volatile counter circuit 100 in accordance with the invention. The non-volatile counter circuit can be integrated into larger integrated circuit (IC) devices. The non-volatile counter circuit can include non-volatile memory 102, a memory controller 104, a counter 106, counter controller logic 108, and a serial interface 110 interconnected on a common bus 112. The non-volatile memory can be, for example, electrically erasable programmable read-only memory (EEPROM) or any other type of non-volatile memory in which the number of times memory cells can be individually erased and programmed is significantly low such that performance of the non-volatile counter circuit would be affected (e.g., memory in which the number of times memory cells can be individually erased and programmed is less than five hundred thousand). For the sake of simplicity, the non-volatile memory will be referred to as EEPROM herein, but other types of non-volatile memory are contemplated. The counter can be a multi-bit counter, which can be implemented by adding logic to registers in the non-volatile counter circuit. The counter controller logic can be a digital circuit that manages how the bits of the counter are passed to the memory controller and stored to memory cells of the EEPROM. The memory controller can be a digital circuit that manages the flow of data from the counter controller logic to the EEPROM for storage. For example, when the counter first updates, the counter can set a first bit to 1 (e.g., 1 in binary) and pass the bit to the memory controller, and the memory controller can manage the flow of the bit to the EEPROM for storage in a first memory cell. When the counter updates a second time, the counter can set the first bit to 0, set a second bit to 1 (e.g., 10 is 2 in binary) and pass the first bit and the second bit to the counter controller logic and to the memory controller. The first memory cell can be erased and the second memory cell can be programmed. Additional bits can be added and written to additional memory cells depending on how high the counter counts. The serial interface can be used to pass the count out of the non-volatile counter circuit, for example, to be used by the larger IC device in which the non-volatile counter circuit is integrated.

In operation, each time the counter updates, the counter circuit updates a first memory cell in EEPROM by programming or erasing the memory cell, while memory cells storing other bits may not be affected by each count (e.g., the second bit remains a "1" when transitioning from binary 2 to binary 3). Generally, each bit of greater significance is updated less frequently than the proceeding less significant bit. Accordingly, lower significant bits are updated more often than more significant bits, which can result in uneven wear of the memory cells in the EEPROM to which the bits are written. Additionally, typical EEPROM memory cells can be programmed and erased around 100,000 times (e.g., 100,000 programs and 100,000 erases each) before the memory cells begin to become unreliable and so the terminal count (e.g., the highest value to which a counter can count) is limited by the number of times the memory cell storing the least significant bit can be updated (e.g., programmed and erased). For example, a 24-bit counter would be limited to a count of 200,000, at which point the memory cell to which the first bit is written would have been written to 100,000 times and may have become unreliable. However, it may be necessary to count to a value higher than the number of times the least significant bit can be updated.

In accordance with an embodiment of the invention, rotating the memory cell in which the least significant bit is stored can increase the terminal count. That is, rather than use a single memory cell to store the least significant bit for all counts, the least significant bit can be stored in one of several memory cells in an array such that wear can be leveled across each memory cell in the array. In an embodiment, a method for implementing a non-volatile counter using non-volatile memory is disclosed. In an embodiment, the method involves distributing operations for storing a low word of a counter in non-volatile memory across memory cells in a memory array in the non-volatile memory, and storing additional bits of the counter in the non-volatile memory in memory cells outside of the memory array, wherein the location in the memory array at which the low word is stored is determined for each count based on the upper bits of the counter. In an embodiment, the low word can be a single bit (e.g., the least significant bit) or any other number of bits (e.g., eight bits forming a byte). Thus, in an embodiment in which the non-volatile memory is EEPROM, updates to memory cells of the EEPROM can be distributed across the EEPROM to level wear across the memory cells. In another embodiment, storing the low word involves erasing set bits (e.g., updating a bit from 1 to 0) or programming unset bits (e.g., updating a bit from 0 to 1). Thus, by using only a half-program cycle (e.g., performing either an erase or a program, but not both), the memory cells can be updated to store a bit twice as many times as a conventional EEPROM. Additionally, by balancing the wear evenly across the memory cells and by using half-write cycles, the terminal count of a counter can be greater than the update limit of one memory cell. For example, by using the above-described technique, a 24-bit counter using 36 bytes of memory could reach a terminal count in excess of 16 million before expiring.

In another embodiment, a non-volatile memory is disclosed. In the embodiment, the non-volatile memory includes a memory controller, at least one memory page electrically coupled to the memory controller, and a memory array electrically coupled to the memory controller, wherein the memory controller is configured to manage a flow of data to the non-volatile memory by storing a low word of the data in the memory array and by storing upper bytes of the data in the at least one memory page, and wherein the low word is stored at a location in the memory array determined based on the upper bytes. Thus, as the count increases and the upper bytes change, the memory controller will change where the low word is stored. Accordingly, wear can be distributed across memory cells in the memory array as a function of the count without storing additional tables or information to record memory cell wear levels in the memory array.

FIG. 2 depicts a functional diagram of a register of a 24-bit counter and EEPROM space. As depicted in FIG. 2, the counter uses 8-bit words and a value from a 24-bit counter consists of three words 202-1-202-3. The low word (e.g. word 202-3) can be stored in a two-dimensional memory array 204 in the EEPROM. Optionally, a redundant copy 206 of the two-dimensional memory array can also be stored in the EEPROM. The upper bits (e.g., additional bits in words 202-1 and 202-2) can be stored in one or more memory pages 208 in the EEPROM as is known in the art. For example, if a memory page is two bytes wide and a word is eight bits long, then the upper two words of the 24-bit counter can be stored in a single memory page. Optionally, a redundant copy of the one or more memory pages storing additional bits can also be stored in a redundant memory page 210. In an embodiment, the location in the memory array at which the low word is stored (e.g., specific memory cells) is determined based on the additional bits such that update operations are distributed across memory cells of the EEPROM in the memory array.

Figure 3A:
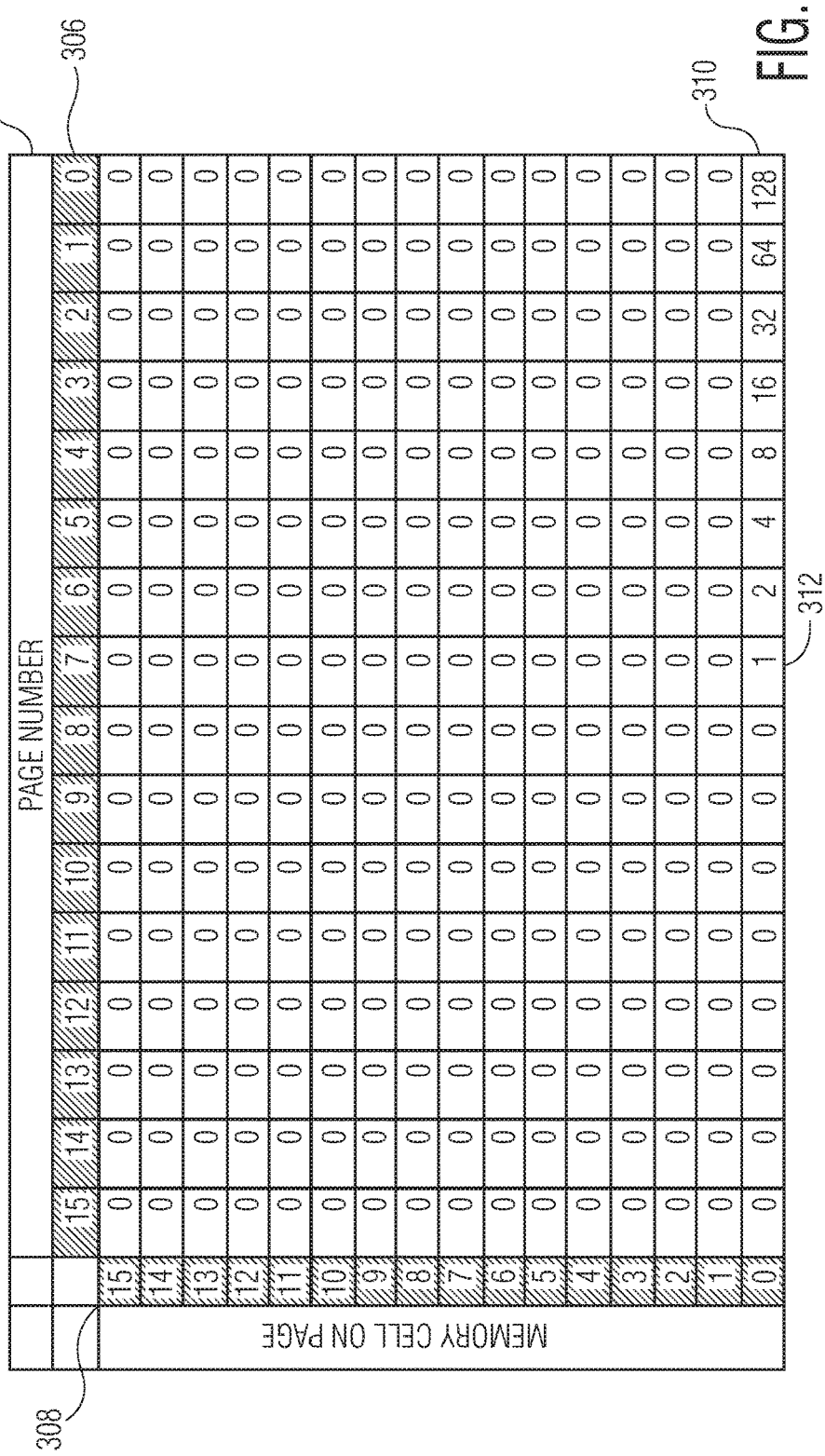

FIGS. 3A-3D illustrate how the low word can be stored in the two-dimensional memory array. As illustrated in FIGS. 3A-3D, the low word is a low byte and is stored in a 32-byte array of memory illustrated by a table. As illustrated in FIG. 3A, the table 304 has 6 rows and 16 columns, while additional bits 350 can be stored in another page or byte. In the array, the columns 306 correspond to pages of memory in EEPROM (indicated by page indexes) and the rows 308 correspond to a memory cell positions within a page. A cell (e.g., cell 310 or cell 312) corresponds to a memory cell at a memory cell position corresponding to the row on a page of memory corresponding to the column of the cell. For example, the cell 310 in the first row and the first column corresponds to the first memory cell on the first page of memory, while the cell in the sixteenth column and the sixteenth row corresponds to the last memory cell on the last page (e.g., the memory cell in the highest memory cell position). As illustrated, the number of memory pages in the memory array is equal to twice the number of bits in the low byte, but the technique contemplates other configurations so long as the number of memory pages in the memory array is at least equal to the number of bits in the low byte (e.g., at least eight pages).

Initially, an X offset and a Y offset are determined based on the additional bits 350 of the counter. For example, the additional bits can be read and X offset can be determined from bits 11:8, while the Y offset can be determined from bits 15:12 of the counter. When the count of the counter is less than 256, bits 15:8 are zero, as illustrated in FIG. 3A, and so the X offset and Y offset are determined to have a value of zero. As a counted event occurs and the counter is updated, the counter circuit is configured to store one bit of the low byte in the memory cell corresponding to the Y offset of eight consecutive pages starting with the page corresponding to the X offset (e.g., the same memory cell positon on 8 pages). In an embodiment, each bit is stored by programming a memory cell if the bit value is going from a 0 to a 1, erasing the bit if the bit value is going from a 1 to a 0, or ignoring the bit if the bit value is not changing. Thus, a full program cycle may not be performed each time the counter increments.

By the time a count of 255 is reached, each of the eight memory cells will be updated (e.g., written and erased) the number of times indicated by the value in the cell corresponding to each memory cell in FIG. 3A. For example, the first memory cell 310 on the first memory page will have been updated 128 times (e.g., written 128 times and erased 128 times), while the first memory cell 312 on the eighth memory page (e.g., the memory page with a page index of 7 in which the most significant bit was stored), will have only been updated once (e.g., 1 program).

Figure 3B:
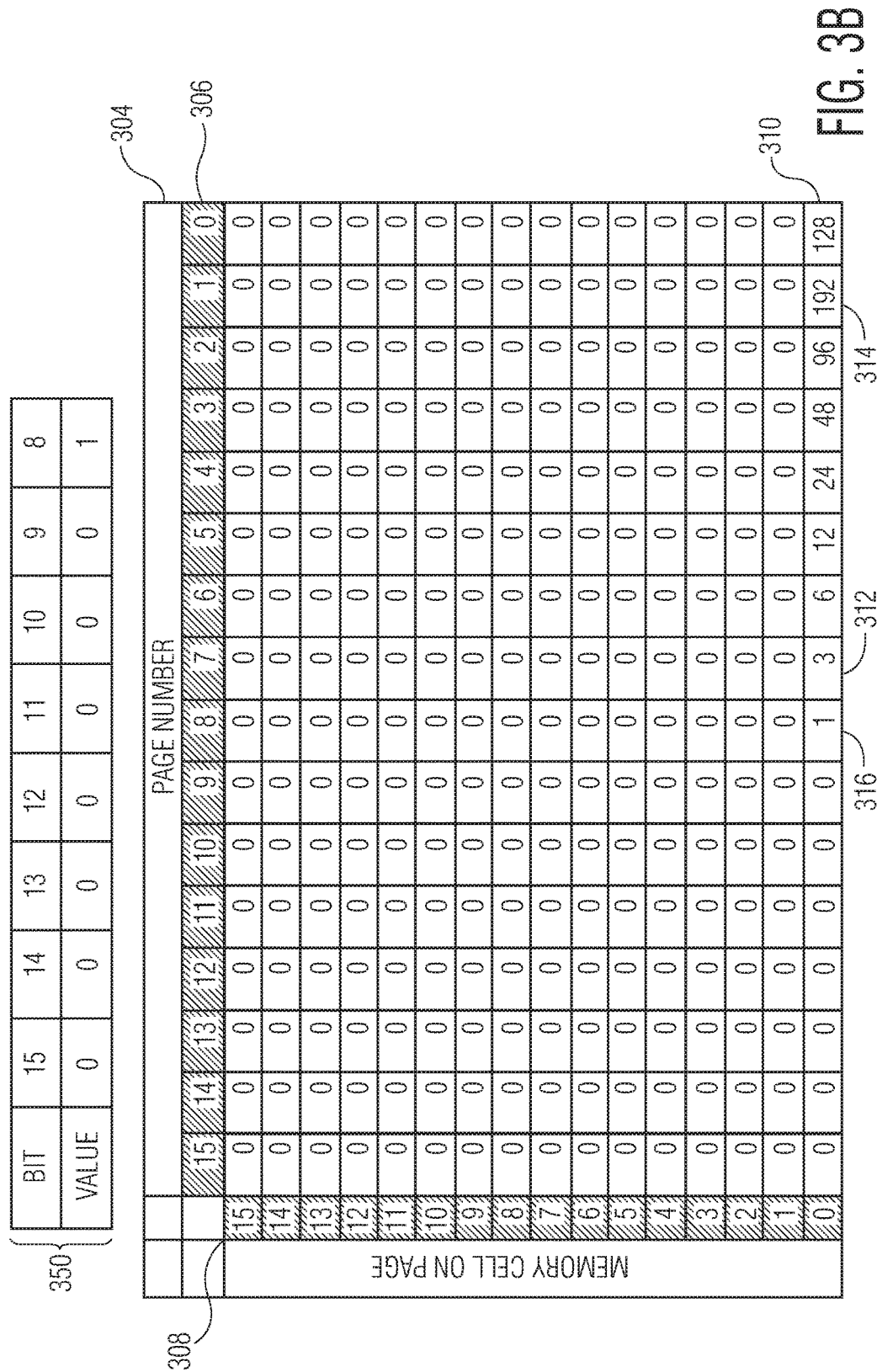

After a predefined number of updates (e.g., programs and erases) to the memory cells, the X offset is incremented and the counter is configured to store the low byte of the count in memory cells starting with the memory cell corresponding to the X offset in the pages beginning with the page corresponding to the Y offset. For example, as illustrated in FIG. 3B, after 255 counts, bit eight of the additional bits is set to 1 and so the X offset is set to 1, while the Y offset remains zero. Accordingly, the memory cell 310 in which the least significant bit was stored for count 0-255 is no longer updated for the next 256 counts, while the memory cell 314 in which the second bit was stored for count 0-255 is now used to store the least significant bit and the most significant bit can be stored in a memory cell 316 on the ninth memory page. Thus, when the counter reaches 511, the memory cells will have been updated the number of times as indicated in FIG. 3B.

The X offset continues to be incremented accordingly until the counter reaches 4,095. In an embodiment, if there are no longer eight consecutive pages of memory (e.g., if the X offset is set to 9-15), then the pages used can wrap. For example, the eight bits of the low byte can be stored in the memory cell on pages 11, 12, 13, 14, 15, 1, 2, and 3 with the least significant bit stored in the memory cell on page 11 and the most significant bit stored in the memory cell on page 3.

Figure 3C:
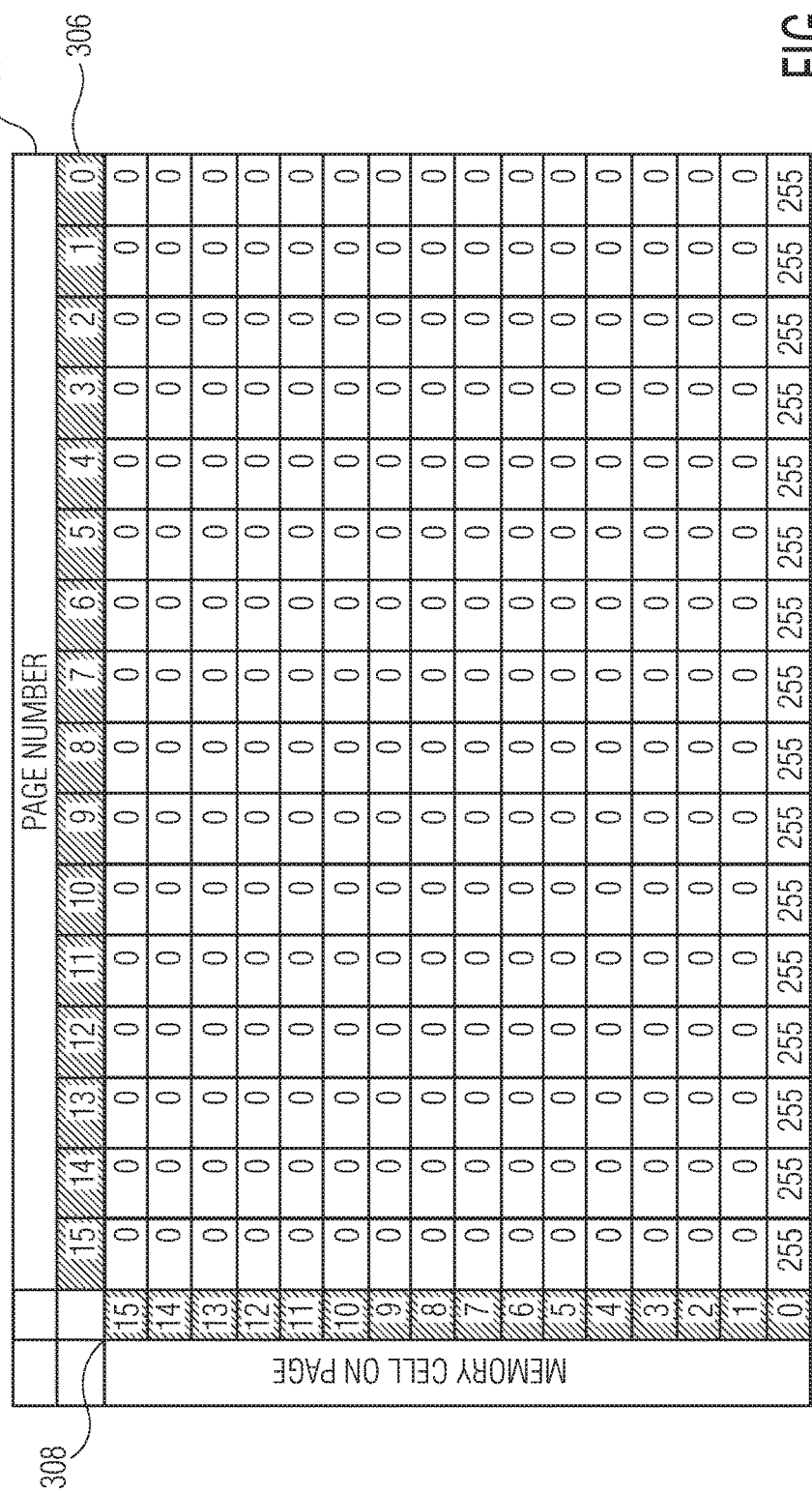

As illustrated in FIG. 3C, once the counter reaches 4,095, additional bits 11:8 are all set to 1 and the first memory cell on each page of memory will have been updated 255 times. As illustrated in FIG. 3D, additional bits 11:8 are set to zero and additional bit 12 is set to 1. Accordingly, the X offset is reset to zero and the Y offset is set to 1. The eight bits of the low byte will then be stored in the second memory cell on each page. For example, when the counter reaches 4,352, the memory cells will have been updated the number of times as indicated by FIG. 3D. The X offset will continue to be incremented and reset and the Y offset will continue to be incremented until the counter reaches a count of 65,535, at which point each memory cell will have been updated 255 times.

The X offset and Y offset can both be reset to zero, a seventeenth bit (not shown) can be set to 1, and the process illustrated in FIGS. 3A-3D can be repeated. In an embodiment, the process can be repeated until each bit in the counter has been set to 1. For example, when bits 23:0 of the 24-bit counter of FIG. 2 are all set to 1 (e.g., the 24-bit counter has reach its maximum count), then the process will stop repeating and each memory cell in the memory array will have been updated 65,280 times, which is less than the number of updates that can be typically performed on a memory cell before it wears out. Thus, by rotating the memory cell in which the least significant bit is stored across the two-dimensional memory array, the wear can be evenly distributed across several memory cells in EEPROM. Accordingly, the terminal count of a counter can be pushed to a value higher than the number of times a single memory cell in EEPROM can be updated.

Protection Against Power Failure

As described above with reference to FIG. 2, a counter can be optionally designed to protect against power failure. It may be beneficial to protect against a power failure because an attacker may be able to exploit a counter by inducing a power failure when a count is being stored to the EEPROM, which may interrupt the program cycle and cause the stored count to be reduced. For example, to transition from 255 to 256, bits 7:0 are erased and bit 8 is written. In an embodiment, two scenarios in which a power failure could result in an erroneous count are envisioned. First, a power failure could occur during an erase. For example, bits 5:0 have been erased, but bits 7 and 6 remain set. Thus, instead of being set to 256, the count would be reduced to 192. Second, a power failure could occur after an erase, but before a program occurs. Thus, instead of being set to 256, the count would be reset to 0.

In order to protect against such scenarios, when a byte is stored, the page of memory in which the byte is stored (e.g., the source page) can be duplicated to make a redundant copy (e.g., the redundant page). Then, the source page can be compared with the redundant page to determine a correct count and, in the case of a discrepancy, the page with the higher count can be written to the other page. For example, if a source page has a count of 0, while a redundant page has a count of 254, the count of the redundant page can be written to the source page. This situation may occur if power is removed during an erase operation or after an erase operation, but before a program operation completes. Similarly, if a source page has a count of 255, while a redundant page has a count of 0, the source page can be written to the redundant page. This situation may occur if power is removed during a program operation.

FIG. 4 is a flow chart diagram of a technique for protecting a non-volatile counter circuit using EEPROM against power failures. At block 402, pages of upper bytes are read (e.g., source pages). In an embodiment, there may be a single page or several pages that are read by the counter controller logic or the memory controller. At block 404, redundant pages of upper bytes (e.g., additional bits) are read. In an embodiment, the number of redundant pages is equal to the number of pages of upper bytes read at block 402. At decision point 406, the pages of upper bytes (e.g., source pages) and the redundant pages of upper bytes (e.g., redundant pages) are compared to determine if they have the same count. In an embodiment, pages have the same count if the bits on the pages equal the same binary value. If the pages do not have the same count, then, at decision point 408, it is determined if the redundant page has a lower count than the source page. At block 410, if the redundant page has a lower count than the source page, then the source page is written to the redundant page. Alternatively, at block 412, if the redundant page does not have a lower count than the source page, then the redundant page is written to the source page. After the page(s) are re-written at either block 410 or 412, the technique returns to block 402 and the source page(s) and redundant page(s) are read and compared again.

If the pages now have the same count, then, at block 414, the low word is read from the source memory array. In an embodiment, the low word is read from the source memory array at an address indicated by the upper bytes. At block 416, the low word copy is read from the redundant memory array. At decision point 418, the low word and the low word copy are compared to determine if they are the same count. In an embodiment, the low word and the low word copy have the same count if the words have equal binary values. If the words do not have the same count then, at decision point 420, it is determined if the low word copy has a lower count than the low word from the source memory array. If the low word copy has a lower count than the low word from the source memory array, then the source memory array is written to the redundant memory array at block 422. Alternatively, if the low word copy has a higher count than the low word from the source memory array, then the redundant memory array is written to the source memory array at block 424. After the memory arrays are re-written at either block 422 or 424, the technique returns to block 414 and the low word from the source memory array and the low word copy from the redundant memory array are read and compared again. If the memory arrays now have the same count, the low word, in conjunction with the upper bytes, indicates a current count and, at block 426, the current count can be passed to a counter within the non-volatile counter circuit for incrementing.

Figure 5:
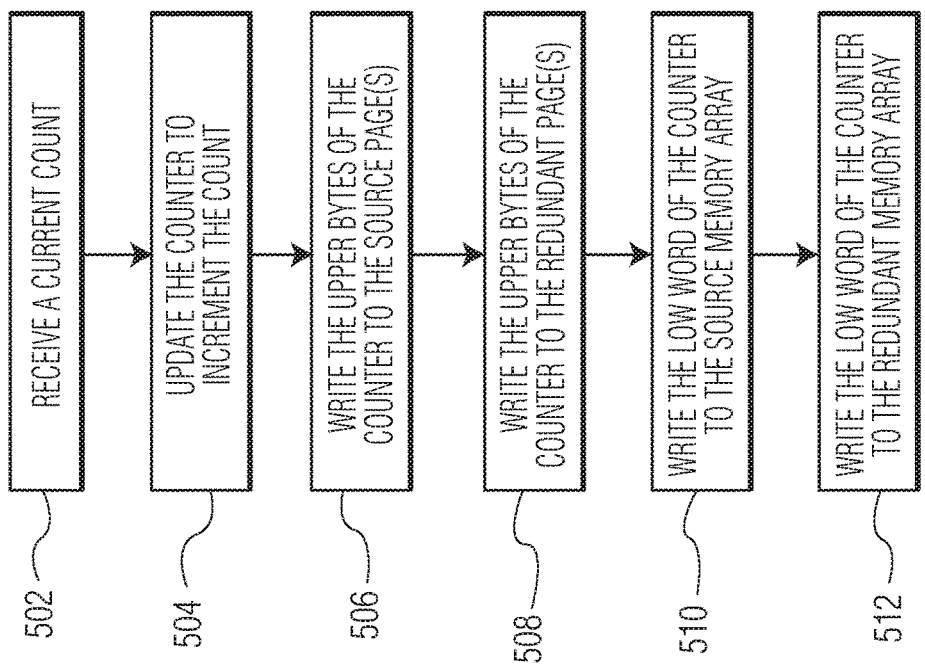
FIG. 5 is a flow chart diagram of a technique for incrementing a non-volatile counter circuit using EEPROM in accordance with an embodiment of the invention

FIG. 5 is a flow chart diagram of a technique for incrementing a non-volatile counter circuit using EEPROM in accordance with an embodiment of the invention. In an embodiment, the technique begins by receiving a current count. At block 502, a current count is received. In an embodiment, the current count is received after the technique described with reference to FIG. 4 is performed. At block 504, a counter is updated to increment the count. In an embodiment, the counter is implemented in the non-volatile counter circuit by a cascade of volatile flip-flops, which are coupled to memory by additional circuitry as described with reference to FIG. 6 below. At block 506, the upper bytes of the counter are written to a source page(s). At block 508, the upper bytes of the counter are written to a redundant page(s). At block 510, the low word of the counter is written to the source memory array. In an embodiment, the upper bytes are used to determine the location at which the low word is written. In an embodiment, the location is the address of a memory cells storing bits of the low word or an index indicating the memory cell in a memory array storing the least significant bit. At block 512, the low word of the counter is written to the redundant memory array. The non-volatile counter then remains idle until the counter updates again and the technique restarts at block 402 in FIG. 4.

Figure 6:
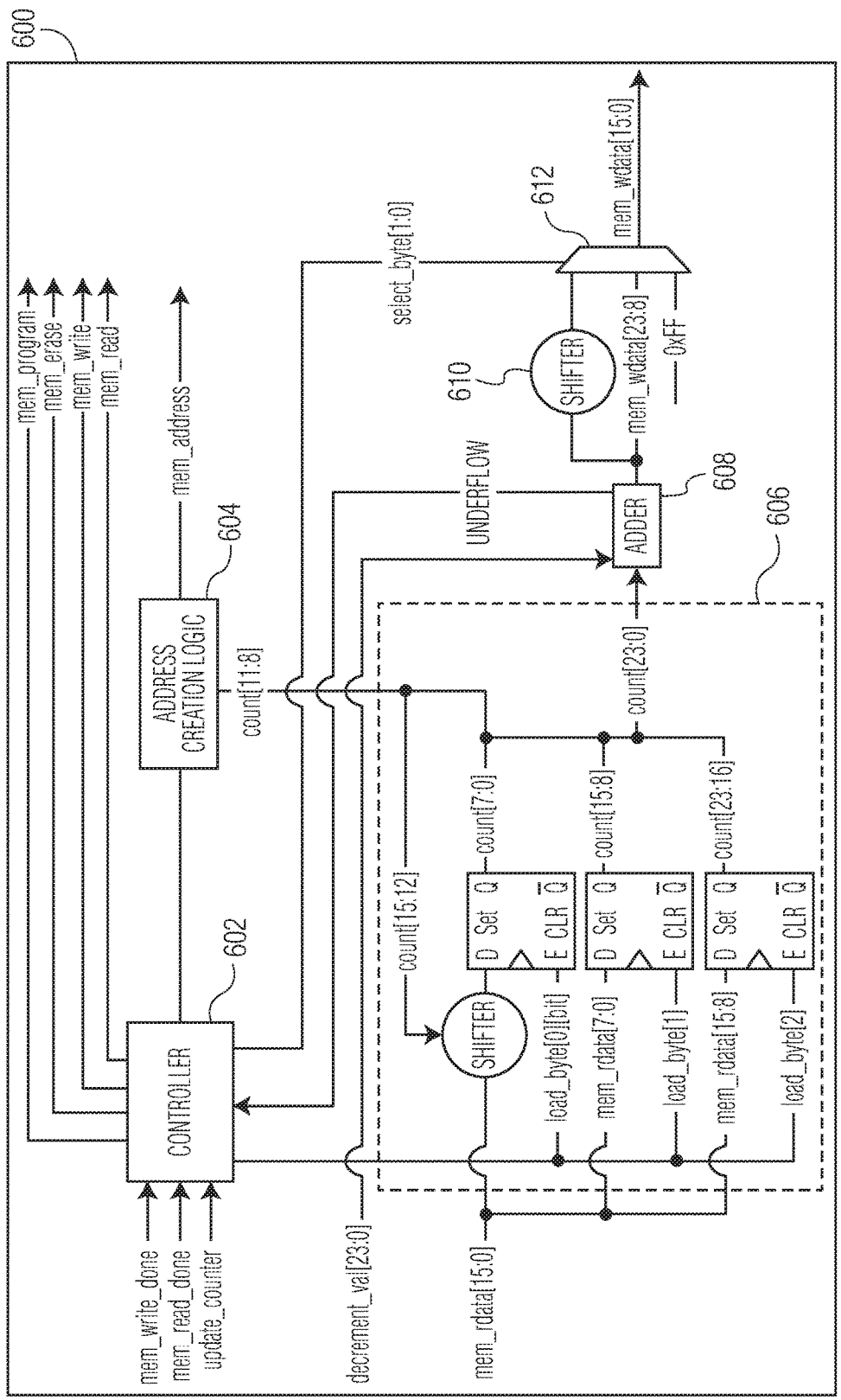
FIG. 6 is a schematic drawing of a non-volatile counter circuit in accordance with an embodiment of the invention Throughout the description, similar reference numbers may be used to identify similar elements.

FIG. 6 is a schematic drawing of the non-volatile counter circuit 600 in accordance with an embodiment of the invention. In the example, the circuit includes a controller 602, address creation logic 604, and counter logic 606, as well as additional circuit elements for outputting counter bits to memory for storage. In an embodiment, the controller can be implemented as a finite state machine (FSM) configured to transition among states for reading the counter, applying an increment value, and storing the updated count into memory. The address creation logic can be circuitry for determining an X and Y offset based on additional bits of the counter. The counter logic can be implemented using D flip-flops arranged such that applying an increment causes a ripple, which updates each flip-flop. Additional circuit elements for outputting counter bits to memory can include, for example, an adder 608, a shifter 610, and a signal generator 612 configured to output counter bits for writing to memory. In an embodiment, the counter circuit can be integrated into a larger integrated circuit to receive inputs and generate outputs such as those depicted in FIG. 6.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for implementing a non-volatile counter using non-volatile memory, the method comprising:
    distributing operations for storing a low word of a counter in non-volatile memory across memory cells in a memory array in the non-volatile memory; and
    storing additional bits of the counter in the non-volatile memory in memory cells outside of the memory array;
    wherein a location in the memory array at which the low word is stored is determined for each count based on the additional bits of the counter.

2. The method of claim 1, wherein an operation for storing the low word of the counter in non-volatile memory comprises:
    programming a memory cell in the memory array when a bit is set to 1; and
    erasing a memory cell in the memory array when a bit set to 1 is set to 0.

3. The method of claim 1,
    wherein the memory array includes a number of memory pages that is at least equal to a number of bits in the low word.

4. The method of claim 1, wherein prior to performing an operation for storing the low word of the counter in non-volatile memory, the method comprises:
    reading the additional bits of the counter from a memory page outside of the memory array;
    determining an X offset and a Y offset from the additional bits; and
    reading the low word from the memory array starting with the memory cell at a memory cell position equal to the Y offset on a memory page within the memory array having an index equal to the X offset.

5. The method of claim 4, wherein the method further comprises:
    reading the additional bits of the counter from at least one redundant memory page;
    reading the low word starting with the memory cell at a memory cell position equal to the Y offset on a memory page in a redundant memory array with a page index equal to the X offset;
    comparing the bits read from the at least one redundant memory page with the bits read from the at least one memory page;
        writing the bits read from the at least one redundant memory page to the at least one memory page if a binary value of the bits read from the at least one redundant memory page is higher than the binary value of bits read from the at least one memory page and/or
        writing the bits read from the at least one memory page to the at least one redundant memory page if the binary value of the bits read from the at least one redundant memory page is lower than the binary value of the bits read from the at least one memory page;
    comparing the low word read from the redundant memory array with the low word read from the memory array; and
        writing the low word read from the redundant memory array to the memory array if a binary value of the low word read from the redundant memory array is higher than a binary value of the low word read from the memory array and/or
        writing the low word read from the memory array to the redundant memory array if a binary value of the low word read from the redundant memory array is lower than a binary value of the low word read from the memory array.

6. A non-volatile memory comprising:
    a memory controller;
    at least one memory page electrically coupled to the memory controller; and
    a memory array electrically coupled to the memory controller;
    wherein the memory controller is configured to implement a non-volatile counter using the non-volatile memory by,
        distributing operations for storing a low word of a counter in the non-volatile memory across memory cells in the memory array;
        storing additional bits of the counter in the memory page of the non-volatile memory in memory cells outside of the memory array;
        wherein a location in the memory array at which the low word is stored is determined for each count based on the additional bits of the counter.

7. The non-volatile memory of claim 6, wherein the memory controller is further configured to:
    read the additional bits of the at least one memory page;
    determine an X offset and a Y offset from the additional bits; and
    read the low word from the memory array starting with the bit at a memory cell position equal to the Y offset on a page with an index equal to the X offset.

8. The non-volatile memory of claim 7, wherein the memory controller is further configured to:
    read bits of at least one redundant memory page;
    read the low word starting at the memory cell position equal to the Y offset on a memory page in a redundant memory array with a page index equal to the X offset;
    compare the bits read from the at least one redundant memory page with the bits read from the at least one memory page;
        write the bits read from the at least one redundant memory page to the at least one memory page if a binary value of the bits read from the at least one redundant memory page is higher than a binary value of the bits read from the at least one memory page and/or
        write the bits read from the at least one memory page to the at least one redundant memory page if the binary value of the bits read from the at least one redundant memory page is lower than the binary value of the bits read from the at least one memory page;
    compare the low word read from the redundant memory array with the low word read from the memory array; and
        write the low word read from the redundant memory array to the memory array if the binary value of the low word read from the redundant memory array is higher than the binary value of the low word read from the memory array and/or
        write the low word read from the memory array to the redundant memory array if the binary value of the low word read from the redundant memory array is lower than the binary value of the low word read from the memory array.

9. A method for implementing a non-volatile counter using non-volatile memory, the method comprising:
storing a low word of a multi-bit counter to a memory array formed by at least one byte and a plurality of memory pages in non-volatile memory by:
determining an X offset having an initial value and determining a Y offset having an initial value;
storing the low word in memory cells at a memory cell position equal to the Y offset on memory pages in the plurality of memory pages starting with the memory page corresponding to the page with a page index equal to the X offset;
incrementing the X offset after a first number of updates to the memory cells at the memory cell position equal to the Y offset;
resetting the X offset to the initial value and incrementing the Y offset when the X offset is incremented to a value greater than the number of memory pages in the plurality of memory pages; and
repeatedly incrementing and resetting the X offset, while incrementing the Y offset until the Y offset is equal to the highest memory cell position within a memory page in the plurality of memory pages and the X offset is equal to the number of memory pages in the plurality of memory pages; and
storing additional bits of the multi-bit counter to at least one memory page in the non-volatile memory.

10. The method of claim 9, wherein storing at least one of a bit in the low word and a bit in the additional bits comprises:
programming a bit to transition from 0 to 1; and
erasing a bit to transition from 1 to 0.

11. The method of claim 9,
wherein the number of memory pages in the plurality of memory pages is at least equal to a number of bits in the low word.

12. The method of claim 9, wherein prior to storing the low word of the multi-bit counter and storing additional bits of the multi-bit counter, the method comprises:
reading additional bits of the multi-bit counter from at least one memory page in the non-volatile memory;
determining an X offset and a Y offset from the additional bits; and
reading the low word from the memory array starting with the bit at the memory cell position equal to the Y offset on a page with an index equal to the X offset.

13. The method of claim 12, wherein the method further comprises:
reading the additional bits of the multi-bit counter from at least one redundant memory page;
reading the low word starting at the memory cell position equal to the Y offset on a memory page in a redundant memory array with a page index equal to the X offset;
comparing the bits read from the at least one redundant memory page with the bits read from the at least one memory page;
writing the bits read from the at least one redundant memory page to the at least one memory page if a binary value of the bits read from the at least one redundant memory page is higher than the binary value of bits read from the at least one memory page and/or
writing the bits read from the at least one memory page to the at least one redundant memory page if the binary value of the bits read from the at least one redundant memory page is lower than the binary value of the bits read from the at least one memory page;
comparing the low word read from the redundant memory array with the low word read from the memory array; and
writing the low word read from the redundant memory array to the memory array if a binary value of the low word read from the redundant memory array is higher than a binary value of the low word read from the memory array and/or
writing the low word read from the memory array to the redundant memory array if a binary value of the low word read from the redundant memory array is lower than a binary value of the low word read from the memory array.

* * * * *